(12) United States Patent
Benkert et al.

(10) Patent No.: US 12,339,341 B2
(45) Date of Patent: Jun. 24, 2025

(54) COMPUTER-IMPLEMENTED METHOD FOR DETERMINING MAGNETIC RESONANCE IMAGES SHOWING DIFFERENT CONTRASTS, MAGNETIC RESONANCE DEVICE, COMPUTER PROGRAM AND ELECTRONICALLY READABLE STORAGE MEDIUM

(71) Applicant: Siemens Healthcare GmbH, Erlangen (DE)

(72) Inventors: Thomas Benkert, Neunkirchen am Brand (DE); Marcel Dominik Nickel, Herzogenaurach (DE); Simon Arberet, Princeton, NJ (US)

(73) Assignee: Siemens Healthineers AG, Erlangen (DE)

( * ) Notice: Subject to any disclaimer, the term of this patent is extended or adjusted under 35 U.S.C. 154(b) by 212 days.

(21) Appl. No.: 18/107,124

(22) Filed: Feb. 8, 2023

(65) Prior Publication Data
US 2023/0251338 A1    Aug. 10, 2023

(30) Foreign Application Priority Data
Feb. 8, 2022   (EP) ................................ 22155650

(51) Int. Cl.
    *G01R 33/56*       (2006.01)
    *G06T 5/70*        (2024.01)
    *G06T 11/00*       (2006.01)
(52) U.S. Cl.
    CPC ............ *G01R 33/5608* (2013.01); *G06T 5/70* (2024.01); *G06T 11/005* (2013.01);
(Continued)

(58) Field of Classification Search
CPC ............. G01R 33/5608; G06T 11/008; G06T 2207/10088; G06T 2207/20081; G06T 2207/20084; G06T 2207/30168
See application file for complete search history.

(56) References Cited

U.S. PATENT DOCUMENTS

| | | | |
|---|---|---|---|
| 2015/0139516 A1* | 5/2015 | Hwang | ..................... G06T 5/70 382/131 |
| 2019/0033409 A1* | 1/2019 | Huang | ................. G01R 33/543 |

(Continued)

OTHER PUBLICATIONS

Perez, E.; Strub, F. et al: "Film: Visual reasoning with a general conditioning layer", in: Proceedings of the AAAI Conference on Artificial Intelligence (vol. 32, No. 1, pp. 3942-3951), 2018.; 2018.
(Continued)

*Primary Examiner* — Gregory H Curran
(74) *Attorney, Agent, or Firm* — Banner & Witcoff Ltd.

(57) ABSTRACT

Techniques are provided for determining magnetic resonance images showing different contrasts in an examination. Magnetic resonance data for all magnetic resonance images are acquired using the same acquisition technique and the magnetic resonance images are reconstructed from their magnetic resonance data sets using at least one reconstruction algorithm. The reconstruction comprises at least one de-noising step. After acquisition of the magnetic resonance data, at least one noise strength measure is determined for the magnetic resonance data sets for each contrast, and de-noising strengths for the de-noising step are chosen individually for each contrast depending on the respective at least one noise strength measure.

16 Claims, 6 Drawing Sheets

(52) U.S. Cl.
CPC .. *G06T 11/008* (2013.01); *G06T 2207/10088* (2013.01); *G06T 2207/20081* (2013.01); *G06T 2207/20084* (2013.01); *G06T 2207/30168* (2013.01)

(56) References Cited

U.S. PATENT DOCUMENTS

2019/0035078 A1* 1/2019 Zaharchuk ............... G06T 5/60
2021/0096205 A1* 4/2021 Kettinger ......... G01R 33/56554

OTHER PUBLICATIONS

Zhang K. et al., "FFDNet: Toward a Fast and Flexible Solution for CNN based Image Denoising", arXiv:1710.04026, 2017.

Nickel, Marcel Dominik et al: "Machine-Learning-Based Denoising of Complex Magnetic-Resonance-Imaging Data Using a Guidance Map"; Prior Art Publishing Gmbh, Prior Art Publishing GmbH, Manfred-Von-Richthofen-Str. 9, 12101 Berlin Germany; vol. www.priorartregister.com, Oct. 20, 2021 (Oct. 20, 2021), pp. 1-2, XP007024392.

Ulyanov, Dmitry et al., "Instance Normalization: The Missing Ingredient for Fast Stylization", Nov. 6, 2017, 6 pp.; 2017.

Hammernik K. et al.:"Learning a Variational Network for Reconstruction of Accelerated MRI Data", arXiv:1704.00447v1 [cs.CV] Apr. 3, 2017.

Robson, Philip M. et al. "Comprehensive Quantification of Signal-to-Noise Ratio and g-Factor for Image-Based and k-Space-Based Parallel Imaging Reconstructions" Magnetic Resonance in Medicine, vol. 60, No. 4, pp. 895-907, 2008; 2008.

Jiahao, Hu et al: "Adaptive Multi-Contrast MR Image Denoising based on a Residual U-Net using Noise Level Map"; Proceedings of the 2021 ISMRM & SMRT Annual Meeting & Exhibition, May 15-20, 2021, ISMRM, 2030 Addison Street, 7th floor, Berkeley, CA 94704 USA; vol. 29, 1243, Apr. 30, 2021 (Apr. 30, 2021), XP040723262.

Hjemant, Kumar Aggarwal et al: "MoDL: Model Based Deep Learning Architecture for Inverse Problems", arxiv.org, Cornell University Library, 201 Olin Library Cornell University Ithaca, NY 14853; Dec. 7, 2017 (Dec. 7, 2017), XP081410975.

Huang, X.; Belongie, S.: "Arbitrary Style Transfer in Real-Time With Adaptive Instance Normalization", in: Proceedings of the IEEE International Conference on Computer Vision (pp. 1501-1510), 2017.

Kellman P. et al.: "Image Reconstruction in SNR units: A General Method for SNR Measurement", vol. 54, Issue6, Dec. 2005, pp. 1439-1447.

Mani, P. Merry et al: "Model-Based Deep Learning for Reconstruction of Joint k-q Under-Sampled High Resolution Diffusion MRI", arxiv.org, Cornell University Library, 201 Olin Library Cornell University Ithaca, NY 14853; Jan. 23, 2020 (Jan. 23, 2020), XP081584206.

* cited by examiner

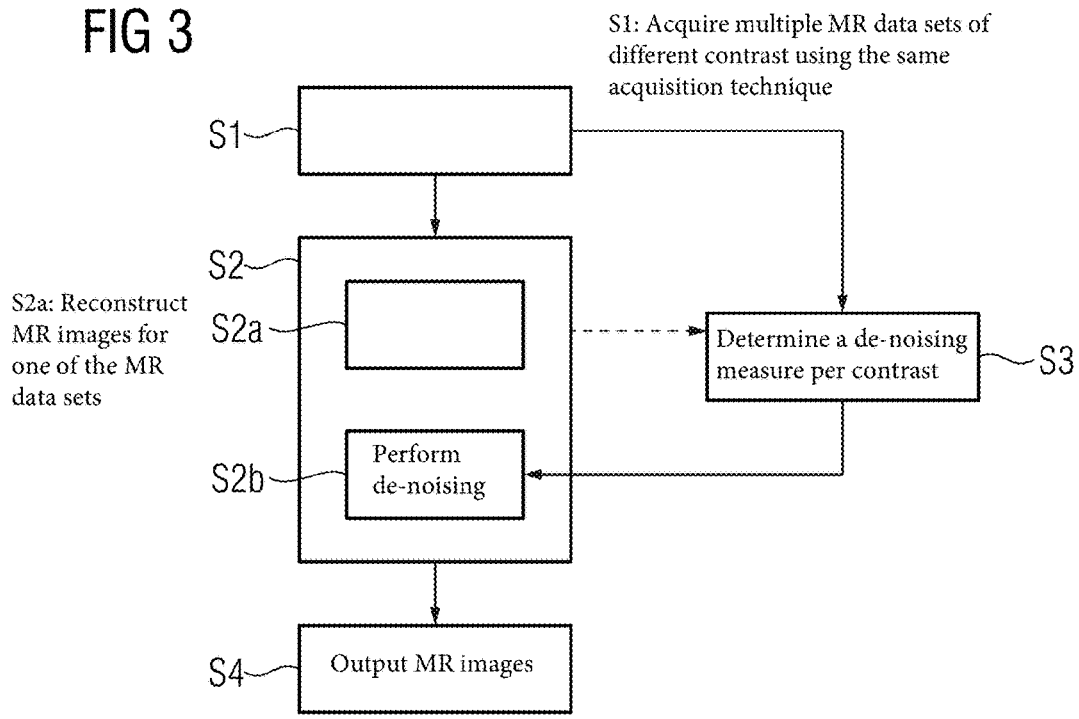
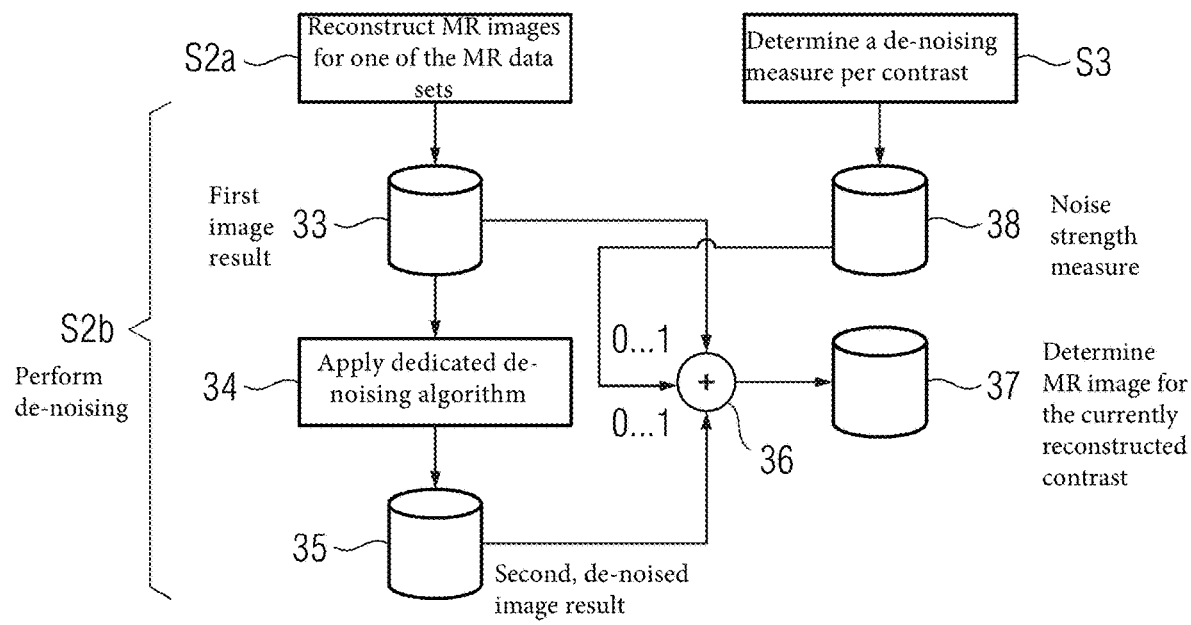

COMPUTER-IMPLEMENTED METHOD FOR DETERMINING MAGNETIC RESONANCE IMAGES SHOWING DIFFERENT CONTRASTS, MAGNETIC RESONANCE DEVICE, COMPUTER PROGRAM AND ELECTRONICALLY READABLE STORAGE MEDIUM

CROSS-REFERENCE TO RELATED APPLICATIONS

The present application claims priority to and the benefit of Europe patent application no. EP 22155650.9, filed on Feb. 8, 2022, the contents of which are incorporated herein by reference in their entirety.

TECHNICAL FIELD

The disclosure is directed to techniques for determining magnetic resonance images showing different contrasts in an examination, wherein magnetic resonance data for all magnetic resonance images are acquired using the same acquisition technique and the magnetic resonance images are reconstructed from their magnetic resonance data sets using at least one reconstruction algorithm, wherein reconstruction comprises at least one de-noising step. The disclosure is further directed to a magnetic resonance device, a computer program, and an electronically readable storage medium.

BACKGROUND

Magnetic resonance imaging (MRI) has become an often-employed modality, in particular in medical imaging. One of the advantages of magnetic resonance imaging is the high number of possible image contrasts. Alongside the well-known basic image contrasts, comprising proton density-weighted, T1-weighted, and T2-weighted imaging, several other acquisition techniques and magnetic resonance sequences have been proposed to determine magnetic resonance images having other image contrasts. A well-known example in this context is diffusion-weighted imaging (DWI). In diffusion-weighted imaging, the Brownian motion of water molecules within a voxel of tissue is to be measured. Here, usually, as a first magnetic resonance image, a so-called b=0 image or a low b image can be acquired, where no or only low diffusion attenuation is present. For example, in some settings, b=50 images may be acquired as low b images. Further, second magnetic resonance images in diffusion-weighted imaging apply a modified excitation sequence, wherein, for example, a strong diffusion gradient is applied symmetrically on either side of the 180° refocusing pulse. While for stationary water molecules, the phase information acquired by the application of the first diffusion gradient is undone by the effects of the second diffusion gradient, moving water molecules are subject to different phase information at the respective times of the diffusion gradients and are not re-phased, resulting in signal loss. Besides this so-called monopolar or Stejskal-Tanner scheme, other approaches, for example bipolar schemes, are known. It is known to combine first and second images of diffusion-weighted imaging to generate isotropic diffusion maps and ADC maps.

To determine magnetic resonance images, magnetic resonance data sets are acquired in k-space and magnetic resonance images are reconstructed therefrom, in particular employing one or more reconstruction algorithms. During or after reconstruction, to further improve image quality, it has also been proposed to perform de-noising in a de-noising step to suppress noise effects in the magnetic resonance images. Many techniques for de-noising have already been proposed in the art, which may, in particular, also employ artificial intelligence by employing trained functions.

In many magnetic resonance examinations, multiple associated magnetic resonance images are determined using the same acquisition technique. For example, it has been proposed to measure magnetic resonance signals at multiple different echo times or using different flip angles. For many acquisition techniques, the resulting magnetic resonance images of different contrasts are often similar with respect to their noise strength, such that de-noising can be applied with one joint de-noising strength in the de-noising step for all those magnetic resonance images.

However, for other acquisition techniques, magnetic resonance images of different contrasts may be acquired, which significantly differ with respect to their noise strength, in particular their signal level, noise level, and/or signal-to-noise ratio (SNR). One example for such an acquisition technique is diffusion-weighted imaging, where magnetic resonance images are acquired with different diffusion encoding, that is, b-values. Depending on the chosen b-values, the SNR can differ significantly. If one joint de-noising strength is applied to different magnetic resonance images of such an examination, this can lead to overly strong de-noising for low b-value images, and to weak de-noising for higher b-value images. This is due to the fact that, with increasing b, the signal strength decreases, leading to lower SNR despite the noise level being comparable. Choosing a de-noising strength which is too high may lead to the potential introduction of undesired blurring/smoothing of magnetic resonance images, while choosing the de-noising strength too low may lead to residual noise after de-noising.

Another example besides diffusion-weighted imaging, where applying a common de-noising strength to magnetic resonance images of different contrast may lead to a decrease in image quality, is parametric imaging, where material parameters in the field of view are quantitatively determined by combining different contrasts.

Generally, image quality problems often occur when the same acquisition technique, in particular the same measurement sequence and/or the same excitation sequence in the same field of view, are used to acquire different contrasts having varying signal strength. Today, this problem is addressed by choosing the de-noising strength to be a compromise regarding the requirements for the different contrasts.

SUMMARY

It is an object of the current disclosure to provide magnetic resonance images of improved image quality regarding de-noising. This object is achieved by the embodiments as described herein, which include a computer-implemented method, a magnetic resonance device, a computer program, and an electronically readable storage medium as described herein and in the claims.

In a method as initially described according to the disclosure:
  after acquisition of the magnetic resonance data, at least one noise strength measure is determined for the magnetic resonance data sets for each contrast, and
  de-noising strengths for the de-noising step are chosen individually for each contrast depending on the respective at least one noise strength measure.

The determination of the noise strength measure, according to the embodiments of the disclosure, is automatically performed via a processor, e.g. in a control device of a magnetic resonance device. In an embodiment, the at least one noise strength measure is determined by automatically evaluating the magnetic resonance data set and/or at least one acquisition parameter of the magnetic resonance data set. For example, a signal strength and/or a signal-to-noise ratio (SNR) may be determined as and/or to determine at least one of the at least one noise strength measure. Regarding acquisition techniques where different noise levels may occur, at least one of the at least one noise strength measure may also comprise or be based on a noise level.

Other methods for automatically determining noise and/or signal characteristics in magnetic resonance data and/or magnetic resonance images are known in the art, and can also be applied here. For example, noise measurements may be performed in areas where constant magnetic resonance signal is expected, for example in areas of the field of view containing air. Additionally, approaches are known in which signal and noise may be at least qualitatively separated and compared, for example by spectral analysis. For instance, the fact that noise is random can be exploited. Additionally, SNR can be determined by modelling the different components of the image reconstruction with respect to their influence on the SNR (See, e.g., P. Kellman et al., "Image reconstruction in SNR units: a general method for SNR measurement", Magn Reson Med 2005; 54:1439-47). Alternatively, Monte Carlo based approaches can be used to assess SNR, based on pseudo-multiple-replicas (see, e.g., P. M. Robson et al., "Comprehensive Quantification of Signal-to-Noise Ratio and g-Factor for Image-Based and k-Space-Based Parallel Imaging Reconstructions", Magn Reson Med 2008; 60:895-907).

The embodiments of the disclosure allow for assigning different de-noising strengths to different contrasts. For example, a stronger de-noising can be applied to magnetic resonance images with (relatively) higher noise, e.g. lower SNR, while weaker de-noising can be applied to magnetic resonance images with (relatively) lower noise, e.g. higher SNR. The selection of the de-noising strengths to apply to the respective contrasts is performed automatically based on the at least one noise strength measure, for example signal strength, SNR, and/or noise strength.

By using different de-noising strengths for different contrasts within one multi-contrast examination, the trade-off between too strong and too weak de-noising can be resolved. For instance, the optimal de-noising strength can be applied for each of the respective different contrasts, hence improving overall image quality.

This is especially advantageous in cases where the signal strength varies between the different contrasts in the acquisition technique. Thus, the magnetic resonance data sets of the different contrasts may be acquired using the same measurement sequence and the same field of view, but with a respectively modified excitation sequence, leading to different signal strengths for different contrasts. Even if the noise characteristics of the different magnetic resonance image data sets are comparable or even the same, differences in signal strength lead to different SNR, and hence different de-noising requirements.

In an embodiment, the acquisition technique is diffusion-weighted imaging, wherein the different contrasts relate to different b-values. The b-value measures the degree of diffusion weighting applied, thereby indicating the amplitude and duration of applied diffusion gradient pulses and the duration between the paired diffusion gradient pulses. In embodiments, the b-value (as an acquisition parameter) can be used as and/or for the determination of at least one of the at least one noise strength measure. In an embodiment, stronger de-noising can be used for high b-values, while weaker de-noising may be used for magnetic resonance images with lower b-values.

However, the current disclosure may also be applied to other cases, for example parametric magnetic resonance imaging and the like.

To allow the use of different de-noising strengths during reconstruction in an efficient manner, e.g. without defining completely different reconstruction paths for different contrasts, different approaches are contemplated according to the embodiments of the current disclosure.

In a first approach, the de-noising step is performed separately from other reconstruction steps and uses a de-noising algorithm, e.g. as a last step during reconstruction. In such a configuration, a first image result for each contrast is obtained from reconstruction steps applied before the de-noising step, wherein in the de-noising step:
  the de-noising algorithm having a predefined, e.g. maximum, de-noising strength is applied to the first image result to determine a second image result, and
  the first image result and the second image result are weightedly combined to determine the magnetic resonance image, wherein the weights are chosen dependent on the at least one noise strength measure for the respective contrast to apply a de-noising strength between zero and the predefined de-noising strength.

Thus, the de-noising step may be performed, e.g. by a de-noising module, at the end of the reconstruction, which yields a first image result. A de-noising algorithm using, e.g., a high predefined de-noising strength, which may be advantageously chosen as the highest conceivable de-noising strength that could be required using the acquisition technique, is applied to the first image result, yielding a second, strongly denoised image result. To determine a final image result, which is the magnetic resonance image, it is interpolated between the first image result and the second image result. The weights to combine these image results are chosen according to the at least one noise strength measure determined for the respective contrast. In this manner, a de-noising strength between zero and the predefined de-noising strength of the de-noising algorithm can be achieved. This approach is easy to implement and can advantageously use one common and clearly defined reconstruction path for all different contrasts, namely the other reconstruction steps and the application of the de-noising algorithm having a predefined de-noising strength. The adaptability to different de-noising strengths is implemented in a simple weighted combination step at the end of the workflow. It is noted that the de-noising algorithm may comprise a trained function, e.g. a neural network, which may, however, not be required in some embodiments.

It should be noted that the application of artificial intelligence and machine learning to the reconstruction of magnetic resonance images has been proposed, and proves suitable, for example, when transforming the k-space magnetic resonance data into the image space, or to improve a preliminary image result to yield an improved image result. Also regarding de-noising, in embodiments of the current disclosure, the de-noising step may involve the application of a trained function, e.g. a neural network. In some embodiments, de-noising is performed together with at least one other reconstruction or generally image processing step in a common neural network, where, jointly, the de-noising operation and at least one further image processing operation are performed during reconstruction.

In general, a trained function mimics cognitive functions that humans associate with other human minds. For example, by training based on training data, the trained function is able to adapt to new circumstances and to detect and extrapolate patterns.

In general, parameters of a trained function can be adapted by means of training. For example, supervised training, semi-supervised training, unsupervised training, reinforcement learning, and/or active learning can be used. Furthermore, representation learning (an alternative term is "feature learning") can be used. For example, the parameters of the trained functions can be adapted iteratively by several steps of training.

For instance, a trained function can comprise a neural network, a support vector machine (SVM), a decision tree, and/or Bayesian network, and/or the trained function can be based on k-means clustering, Q-learning, genetic algorithms, and/or association rules. For example, a neural network can be a deep neural network, a convolutional neural network, or a convolutional deep neural network. Furthermore, a neural network can be an adversarial network, a deep adversarial network, and/or a generative adversarial network (GAN).

In a second approach, at least one noise strength measure and/or a value derived therefrom, e.g. the de-noising strength to be used, are supplied as input data, e.g. as meta data, to the trained function. In other words, the trained function performing the de-noising is not only trained regarding different magnetic resonance images to be denoised, but also to accept meta data describing a required de-noising strength as an additional input such that the de-noising strength of the trained function can be adapted for different contrasts by providing the respective meta data. In other words, the level of de-noising required is passed as meta data to the trained function, e.g. to the neural network.

In an embodiment, the noise strength measure may be determined in a spatially resolved manner and provided to the trained function as (e.g. part of) a noise level map. Such an approach has, for example, been described in K. Zhang et al., "FFDNet: Toward a Fast and Flexible Solution for CNN based Image De-noising", arXiv:1710.04026, 2017, and provides a very detailed noise information for each magnetic resonance image/contrast.

The concept of providing meta data as additional input, e.g. by concatenation, or to re-parametrize trained functions, in particular neural networks, is known. For example, style transfer approaches have been described which can be applied to multiple target styles. Even arbitrary styles can be transferred. It is exemplary referred to the articles by X. Huang and S. Belongie, "Arbitrary Style Transfer in Real-time with Adaptive Instance Normalization", in: Proceedings of the IEEE International Conference on Computer Vision 2017, pages 1501-1510; E. Perez et al., "FiLM: Visual Reasoning with a General Conditioning Layer", in: Proceedings of the AAAI Conference on Artificial Intelligence 2018, volume 32, No. 1, pages 3942-3951; and D. Ulyanov et al., "Instance Normalization: The Missing Ingredient for Fast Stylization", arXiv: 1607.08022, preprint, 2016.

In a third approach, multiple trained functions trained for multiple de-noising strengths and/or de-noising strength intervals may be provided, wherein, for each contrast, the trained function to be applied is chosen depending on the at least one noise strength measure. In an embodiment, the trained functions may have the same network architecture, but are differently parametrized to yield different de-noising strengths. For example, neural networks may have an identical network structure, but different sets of weights. In embodiments, the trained functions are trained based on the same training data using different amounts of artificial noise pre-added to training input data. In other words, the trained functions may be trained using different noise augmentation factors, for example different levels of pre-added noise to the training input data. In this manner, each of the separate trained functions is trained to apply a different de-noising strength. Hence, a suitable trained function may be chosen for each of the different contrasts depending on the noise strength measure. In this approach, very high image qualities can be achieved, since trained functions dedicatedly trained for the noising strength to be applied are used.

Finally, in a fourth approach, a variational neural network may be used to reconstruct images from k-space magnetic resonance data sets, wherein a data consistency step and a regularization step are repeatedly performed in a series of gradient descent steps to obtain denoised magnetic resonance images, as, for example, described in K. Hammernik et al., "Learning a variational network for reconstruction of accelerated MRI data", Magn Reson Med 2017; 79:3055-71. Here, it is proposed to choose a de-noising strength for each contrast by adapting the relative scaling between the data consistency step and the regularization step depending on the at least one noise strength measure. In this manner, the de-noising strength can be influenced, wherein, e.g. higher relative scaling of the regularization step leads to stronger de-noising.

In an embodiment, the magnetic resonance images may be displayed to the user, wherein upon user interaction the at least one noise strength measure for at least one contrast is updated based on user input, and at least the de-noising step for this contrast is repeated based on the updated noise strength measure. If an automatically chosen de-noising strength leads to results which can be optimized, a user may interact with the control device performing the method to modify noise strength measures, and apply correspondingly updated de-noising strengths. The user can view the effects of this modification in the display of the magnetic resonance images. For example, sliders or the like may be used, if the updated de-noising result can be determined in real time, for example when using the first approach.

The disclosure further concerns a magnetic resonance device comprising a control device configured to perform a method according to the disclosure. Therefore, the control device may comprise at least one processor and/or at least one memory. In concrete embodiments, the control device may comprise an acquisition unit as in principle is generally known. The acquisition unit controls further components of the magnetic resonance device to acquire magnetic resonance data sets according to the acquisition technique, e.g. employing magnetic resonance sequences comprising excitation sequences and measurement sequences (often also called excitation modules and measurement (or readout) modules). The control device may further comprise at least one determination unit for determining the at least one noise strength measure for each contrast, and a reconstruction unit for reconstructing the magnetic resonance images from the magnetic resonance data sets. The reconstruction unit may comprise a de-noising sub-unit for performing the de-noising step, e.g. using, for each contrast, a de-noising strength dependent on the respective at least one noise strength measure. The control device may also comprise an output interface for outputting generated magnetic resonance images.

A computer program according to the disclosure can be directly loaded into a control device of a magnetic resonance device and configures the control device to perform the steps of a method according to the disclosure when the computer program is executed on the control device of the magnetic resonance device. The computer program may be stored on an electronically readable storage medium according to the disclosure, which thus comprises control information comprising at least one computer program according to the disclosure stored thereon, such that, when the electronically readable storage medium is used in a control device of a magnetic resonance device, the control device of the magnetic resonance device performs the steps of a method according to the disclosure. The electronically readable storage medium according to the disclosure may be, e.g., a non-transitory storage medium, for example a CD ROM.

BRIEF DESCRIPTION OF THE DRAWINGS

Other objects and features of the present disclosure will become apparent from the following detailed description considered in conjunction with the accompanying drawings. The drawings, however, are principle sketches designed for the purpose of illustration and do not limit the disclosure. The drawings show:

FIG. 3 illustrates an example flowchart according to one or more embodiments of the disclosure;

FIG. 4 illustrates an example functional diagram of a first embodiment of the disclosure;

DETAILED DESCRIPTION OF THE DISCLOSURE

Figure 1:
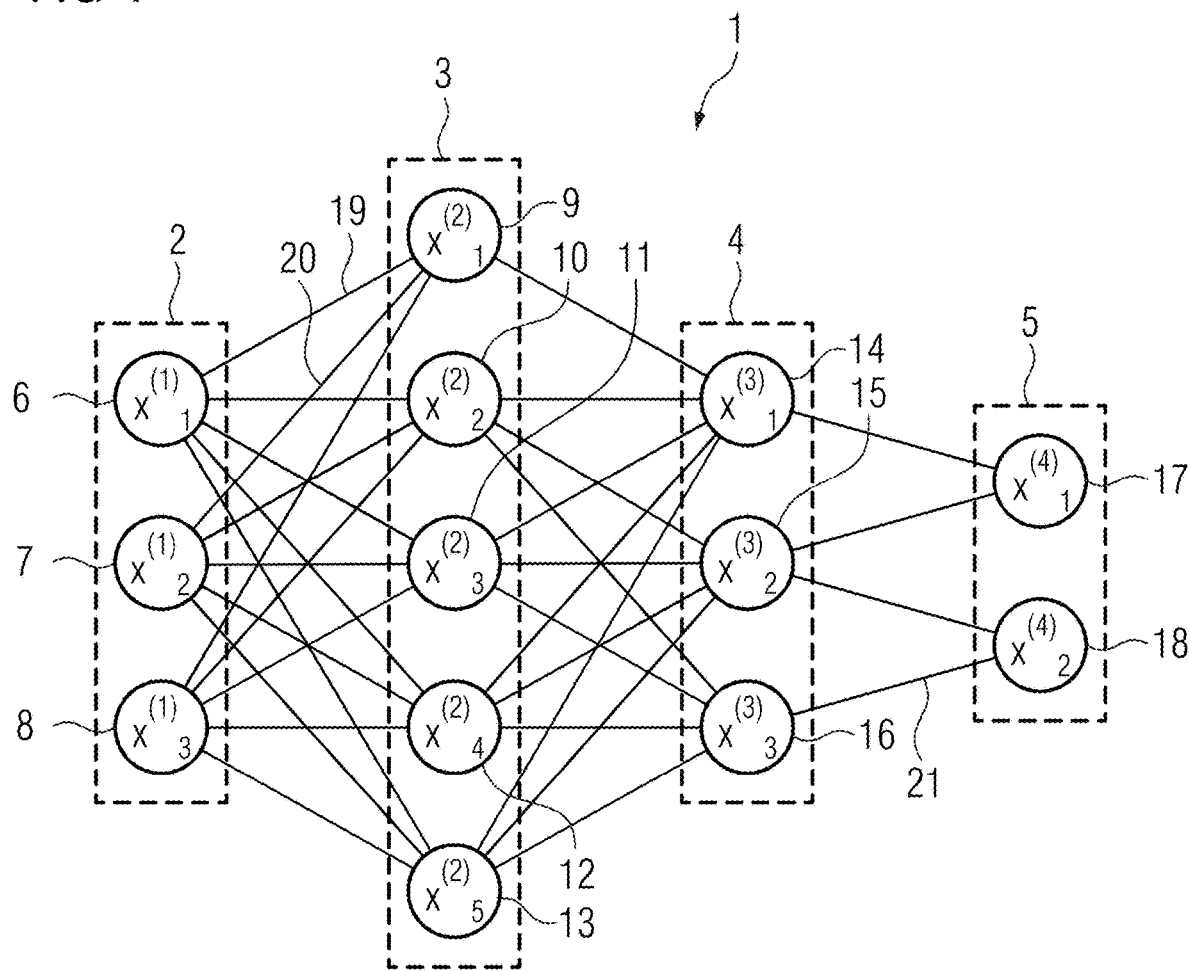
FIG. 1 illustrates an example neural network according to one or more embodiments of the disclosure.

FIG. 1 illustrates an example artificial neural network 1 according to one or more embodiments of the disclosure. Alternative terms for "artificial neural network" may include e.g. "neural network", "artificial neural net" or "neural net".

The artificial neural network 1 comprises nodes 6-18 and edges 19-21, wherein each edge 19-21 is a directed connection from a first node 6-18 to a second node 6-18. In general, the first node 6-18 and the second node 6-18 are different nodes 6-18. It is also possible that the first node 6-18 and the second node 6-18 are identical. For example, in FIG. 1 the edge 19 is a directed connection from the node 6 to the node 9, and the edge 20 is a directed connection from the node 7 to the node 9. An edge 19-21 from a first node 6-18 to a second node 6-18 is also denoted as "ingoing edge" for the second node 6-18 and as "outgoing edge" for the first node 6-18.

In the present embodiment, the nodes 6-18 of the artificial neural network 1 can be arranged in layers 2-5, wherein the layers 2-5 can comprise an intrinsic order introduced by the edges 19-21 between the nodes 6-18. For instance, edges 19-21 can exist only between neighboring layers of nodes 6-18. In the present embodiment, there is an input layer 2 comprising only nodes 6-8 without an incoming edge, an output layer 5 comprising only nodes 17, 18 without outgoing edges, and hidden layers 3, 4 in-between the input layer 2 and the output layer 5. In general, the number of hidden layers 3, 4 can be chosen arbitrarily. The number of nodes 6-8 within the input layer 2 usually relates to the number of input values of the neural network, and the number of nodes 17, 18 within the output layer 5 usually relates to the number of output values of the neural network.

In an embodiment, a (real) number can be assigned as a value to every node 6-18 of the neural network 1. Here, $x^{(n)}_i$ denotes the value of the i-th node 6-18 of the n-th layer 2-5. The values of the nodes 6-8 of the input layer 2 are equivalent to the input values of the neural network 1, the values of the nodes 17, 18 of the output layer 5 are equivalent to the output values of the neural network 1. Furthermore, each edge 19-21 can comprise a weight being a real number, in particular, the weight is a real number within the interval $[-1, 1]$ or within the interval $[0, 1]$. Here, $w^{(m,n)}_{i,j}$ denotes the weight of the edge between the i-th node 6-18 of the m-th layer 2-5 and the j-th node 6-18 of the n-th layer 2-5. Furthermore, the abbreviation $w^{(n)}_{i,j}$ is defined for the weight $w^{(n,n+1)}_{i,j}$.

In an embodiment, to calculate the output values of the neural network 1, the input values are propagated through the neural network 1. For example, the values of the nodes 6-18 of the (n+1)-th layer 2-5 can be calculated based on the values of the nodes 6-18 of the n-th layer 2-5 represented by Equation 1 below as follows:

$$x_j^{(n+1)} = f(\Sigma_i x_i^{(n)} \cdot w_{i,j}^{(n)})$$ Eqn. 1:

Herein, the function f is a transfer function (another term is "activation function"). Known transfer functions are step functions, sigmoid function (e.g. the logistic function, the generalized logistic function, the hyperbolic tangent, the Arctangent function, the error function, the smoothstep function), or rectifier functions. The transfer function is mainly used for normalization purposes.

In an embodiment, the values are propagated layer-wise through the neural network 1, wherein values of the input layer 2 are given by the input of the neural network 1, wherein values of the first hidden layer 3 can be calculated based on the values of the input layer 2 of the neural network 1, wherein values of the second hidden layer 4 can be calculated based in the values of the first hidden layer 3, etc.

To set the values $w^{(m,n)}_{i,j}$ for the edges 19-21, the neural network 1 has to be trained using training data. For instance, training data comprises training input data and training output data (denoted as $t_i$). For a training step, the neural network 1 is applied to the training input data to generate calculated output data. For instance, the training data and the calculated output data comprise a number of values, said number being equal to the number of nodes 17, 18 of the output layer 5.

In an embodiment, a comparison between the calculated output data and the training data is used to recursively adapt the weights within the neural network 1 (backpropagation algorithm). For example, the weights are changed according to Equation 2 below as follows:

$$w_{i,j}'^{(n)} = w_{i,j}^{(n)} - \gamma \cdot \delta_j^{(n)} \cdot x^{(n)},$$ Eqn. 2:

wherein γ represents a learning rate, and the numbers $\delta^{(n)}_j$ can be recursively calculated in accordance with Equations 3A-3B below as follows:

$$\delta_j^{(n)} = (\Sigma_k \delta_k^{(n+1)} \cdot w_{j,k}^{(n+1)}) \cdot f'(\Sigma_i x_i^{(n)} \cdot w_{i,j}^{(n)}) \qquad \text{Eqn. 3A:}$$

based on $\delta^{(n+1)}_j$ if the (n+1)-th layer is not the output layer 5, and $$\delta_j^{(n)} = (x_k^{(n+1)} - t_j^{(n+1)}) \cdot f'(\Sigma_i x_i^{(n)} \cdot w_{i,j}^{(n)}), \qquad \text{Eqn. 3B:}$$

if the (n+1)-th layer is the output layer 5, wherein f' represents the first derivative of the activation function, and $t_j^{(n+1)}$ represents the comparison training value for the j-th node of the output layer 5.

Figure 2:
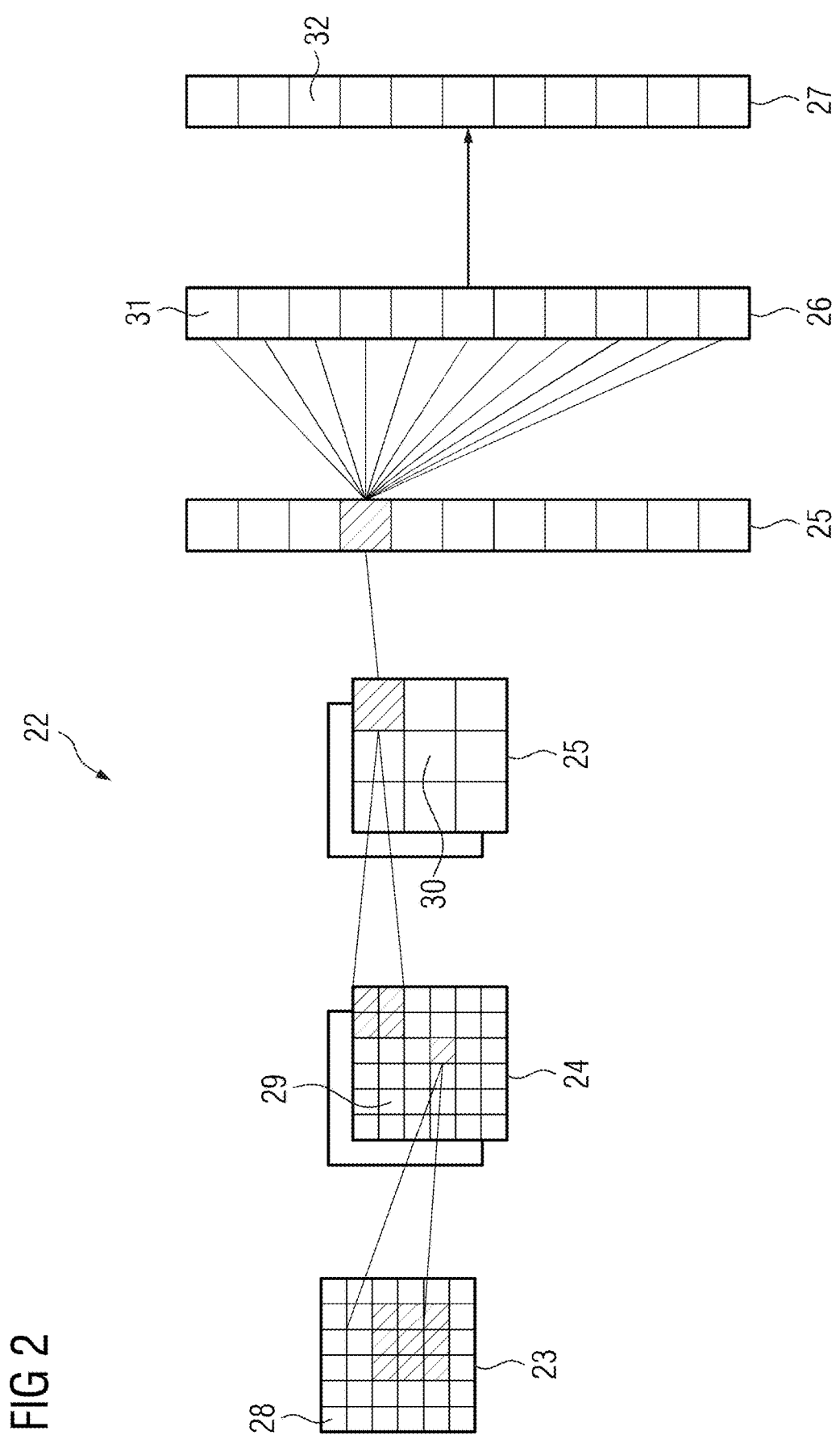
FIG. 2 illustrates an example convolutional neural network according to one or more embodiments of the disclosure.

FIG. 2 illustrates an example convolutional neural network 22 according to one or more embodiments of the disclosure. In the present embodiment, the convolutional neural network 22 comprises an input layer 23, a convolutional layer 24, a pooling layer 25, a fully connected layer 26, and an output layer 27. Alternatively, the convolutional neural network 22 can comprise several convolutional layers 24, several pooling layers 25, and several fully connected layers 26, as well as other types of layers. The order of the layers can be chosen arbitrarily; usually fully connected layers 26 are used as the last layers before the output layer 27.

In an embodiment, within a convolutional neural network 22 the nodes 28-32 of one layer 23-27 can be considered to be arranged as a d-dimensional matrix or as a d-dimensional image. For example, in the two-dimensional case, the value of the node 28-32 indexed with i and j in the n-th layer 23-27 can be denoted as $x^{(n)}[i,j]$. However, the arrangement of the nodes 28-32 of one layer 23-27 does not have an effect on the calculations executed within the convolutional neural network 22 as such, since these are given solely by the structure and the weights of the edges.

In an embodiment, a convolutional layer 24 is characterized by the structure and the weights of the incoming edges forming a convolution operation based on a certain number of kernels. For example, the structure and the weights of the incoming edges are chosen such that the values $x^{(n)}_k$ of the nodes 29 of the convolutional layer 24 are calculated as a convolution $x^{(n)}_k = K_k * x^{(n-1)}$ based on the values $x^{(n-1)}$ of the nodes 28 of the preceding layer 23, where the convolution * is defined in the two-dimensional case in accordance with Equation 4 as follows:

$$x_k^{(n)}[i,j] = (K_k * x^{(n-1)})[i,j] = \Sigma_i \Sigma_j K_k[i',j'] \cdot x^{(n-1)}[i-i',j-j'] \qquad \text{Eqn. 4:}$$

Here, the k-th kernel $K_k$ represents a d-dimensional matrix (in this embodiment, a two-dimensional matrix), which is usually small compared to the number of nodes 28-32 (e.g. a 3×3 matrix, or a 5×5 matrix). For example, this implies that the weights of the incoming edges are not independent, but chosen such that they produce said convolution equation. For instance, for a kernel being a 3×3 matrix, there are only 9 independent weights (each entry of the kernel matrix corresponding to one independent weight), irrespectively of the number of nodes 28-32 in the respective layer 23-27. For example, for a convolutional layer 24 the number of nodes 29 in the convolutional layer is equivalent to the number of nodes 28 in the preceding layer 23 multiplied with the number of kernels.

If the nodes 28 of the preceding layer 23 are arranged as a d-dimensional matrix, using a plurality of kernels can be interpreted as adding a further dimension (denoted as "depth" dimension), so that the nodes 29 of the convolutional layer 24 are arranged as a (d+1)-dimensional matrix. If the nodes 28 of the preceding layer 23 are already arranged as a (d+1)-dimensional matrix comprising a depth dimension, using a plurality of kernels can be interpreted as expanding along the depth dimension, so that the nodes 29 of the convolutional layer 64 are arranged also as a (d+1)-dimensional matrix, wherein the size of the (d+1)-dimensional matrix with respect to the depth dimension is by a factor of the number of kernels larger than in the preceding layer 23.

The advantage of using convolutional layers 24 is that spatially local correlation of the input data can exploited by enforcing a local connectivity pattern between nodes of adjacent layers, e.g. by each node being connected to only a small region of the nodes of the preceding layer.

In the present embodiment, the input layer 23 comprises 36 nodes 28, arranged as a two-dimensional 6×6 matrix. The convolutional layer 24 comprises 72 nodes 29, arranged as two two-dimensional 6×6 matrices, each of the two matrices being the result of a convolution of the values of the input layer 23 with a kernel. Equivalently, the nodes 29 of the convolutional layer 24 can be interpreted as arranged as a three-dimensional 6×6×2 matrix, wherein the last dimension is the depth dimension.

A pooling layer 25 can be characterized by the structure and the weights of the incoming edges and the activation function of its nodes 30 forming a pooling operation based on a non-linear pooling function f. For example, in the two-dimensional case the values $x^{(n)}$ of the nodes 30 of the pooling layer 25 can be calculated based on the values $x^{(n-1)}$ of the nodes 29 of the preceding layer 24 in accordance with Equation 5 below as follows:

$$x^{(n)}[i,j] = f(x^{(n-1)}[id_1, jd_2], \ldots, x^{(n-1)}[id_1+d_1-1, jd_2+d_2-1]) \qquad \text{Eqn. 5:}$$

In other words, by using a pooling layer 25, the number of nodes 29, 30 can be reduced by replacing a number $d_1 \cdot d_2$ of neighboring nodes 29 in the preceding layer 24 with a single node 30 being calculated as a function of the values of said number of neighboring nodes in the pooling layer 25. For instance, the pooling function f can be the max-function, the average, or the L2-Norm. For example, for a pooling layer 25 the weights of the incoming edges may be fixed and not modified by training.

The advantage of using a pooling layer 25 is that the number of nodes 29, 30 and the number of parameters is reduced. This leads to the amount of computation in the network 22 being reduced and to a control of overfitting.

In the present embodiment, the pooling layer 25 is a max-pooling, replacing four neighboring nodes with only one node, the value being the maximum of the values of the four neighboring nodes. The max-pooling is applied to each d-dimensional matrix of the previous layer 24; in this embodiment, the max-pooling is applied to each of the two two-dimensional matrices, reducing the number of nodes from 72 to 18.

A fully-connected layer 26 can be characterized by the fact that a majority, e.g. all, edges between nodes 30 of the previous layer 25 and the nodes 31 of the fully-connected layer 26 are present, and wherein the weight of each of the edges can be adjusted individually.

In the present embodiment, the nodes 30 of the preceding layer 25 of the fully-connected layer 26 are displayed both as two-dimensional matrices, and additionally as non-related nodes (indicated as a line of nodes, wherein the number of nodes was reduced for a better presentability). In the present embodiment, the number of nodes 31 in the fully connected layer 26 is equal to the number of nodes 30 in the preceding layer 25. Alternatively, the number of nodes 30, 31 can differ.

Furthermore, in the present embodiment the values of the nodes 32 of the output layer 27 are determined by applying the Softmax function onto the values of the nodes 31 of the preceding layer 26. By applying the Softmax function, the sum of the values of all nodes 32 of the output layer 27 is 1, and all values of all nodes 32 of the output layer 27, are real numbers between 0 and 1. For example, if using the convolutional neural network 22 for categorizing input data, the values of the output layer can be interpreted as the probability of the input data falling into one of the different categories.

A convolutional neural network 22 can also comprise a ReLU (acronym for "rectified linear units") layer. For example, the number of nodes and the structure of the nodes contained in a ReLU layer is equivalent to the number of nodes and the structure of the nodes contained in the preceding layer. For example, the value of each node in the ReLU layer is calculated by applying a rectifying function to the value of the corresponding node of the preceding layer. Examples for rectifying functions are $f(x)=\max(0,x)$, the tangent hyperbolics function, or the sigmoid function.

In an embodiment, the convolutional neural network 22 can be trained based on the backpropagation algorithm. For preventing overfitting, methods of regularization can be used, e.g. dropout of nodes 28-32, stochastic pooling, use of artificial data, weight decay based on the L1 or the L2 norm, or max norm constraints.

FIG. 3 illustrates an example flowchart according to one or more embodiments of the disclosure. In step S1, multiple associated magnetic resonance data sets of different contrast are acquired using the same acquisition technique during an examination. Here, the same measurement sequence is used for all magnetic resonance data sets; however, the excitation is modified such that the noise characteristics of all magnetic resonance data sets are comparable, but the signal strength varies. For example, the acquisition technique can be diffusion weighted imaging (DWI), where a b=0 or low b, for example b=50, data set may be acquired with no or weak diffusion gradients applied. Furthermore, one or more b>0 data sets may be acquired using diffusion gradients. Monopolar or bipolar schemes may be used.

In a step S2, magnetic resonance images are reconstructed for each magnetic resonance data set, that is, each contrast. Here, several reconstruction steps S2a may be employed, however, reconstruction in step S2 at least comprises a de-noising step S2b, in particular as the last step. However, it is understood that the de-noising step S2b may be combined with one or more other reconstruction steps S2a, that is, de-noising may be performed combined with another image processing operation. Alternatively, a dedicated de-noising algorithm (de-noising module) may be used.

In the method described here, different de-noising strengths are applied to different contrasts to optimize image quality regarding de-noising, e.g. to prevent too strong or too weak de-noising. Therefore, in a step S3, a de-noising strength measure is determined for each of the contrasts. While in some applications, at least one of the at least one noise strength measure may already be given by an acquisition parameter of the respective magnetic resonance data set, additionally or alternatively, at least one of the at least one noise strength measure may also be determined from the magnetic resonance data, e.g. also from intermediate results of reconstruction steps S2a, for example a preliminary image transformed into image space. For example, a signal strength, a signal-to-noise ratio, and/or a noise strength may be determined by such an evaluation. In the case of diffusion weighted imaging, the b-value can be employed as or as a basis for determination of the at least one noise strength measure. In this example, lower b-values lead to a lower de-noising strength, since a higher SNR is expected.

As can be seen in FIG. 3, the determined at least one noise strength measure is provided to the de-noising step S2b to choose a suitable de-noising strength for each contrast.

In a step S4, the magnetic resonance images determined in step S2 are output. Here, in some embodiments, a user interaction option may be provided in the user interface for displaying the magnetic resonance images, allowing a user to modify determined noise strength values or de-noising strength derived therefrom, for example by a slider, wherein, e.g. in real time, the display of the magnetic resonance images may be updated according to the modification by at least partially re-executing the de-noising step S2b. For instance, intermediate results used in de-noising step S2b may be stored until user interaction indicating finality of the results is received.

In the following, concrete embodiments regarding the de-noising step S2b will be discussed with respect to FIGS. 4 to 6. In the first embodiment of FIG. 4, the de-noising step S2b is the last step of the reconstruction in step S2. The previous reconstruction steps S2a yield a first image result 33. A dedicated de-noising algorithm 34, which may or may not comprise a trained function, is applied to the first image result 33 to determine a second, denoised image result 35. The de-noising algorithm 34 uses a predefined de-noising strength, which preferably is the highest expected required de-noising strength.

In a combination sub-step 36 of de-noising step S2b, the first image result 33 and the second image result 35 are weightedly combined to determine the magnetic resonance image 37 for the currently reconstructed contrast as a final result. Here, the at least one noise strength measure 38 determined in step S3 is used to determine the weights in combination sub-step 36.

Thus, in this manner, de-noising strengths between the predefined de-noising strength of the de-noising algorithm 34 and zero can be chosen according to the requirements for the different contrasts.

Figure 5:
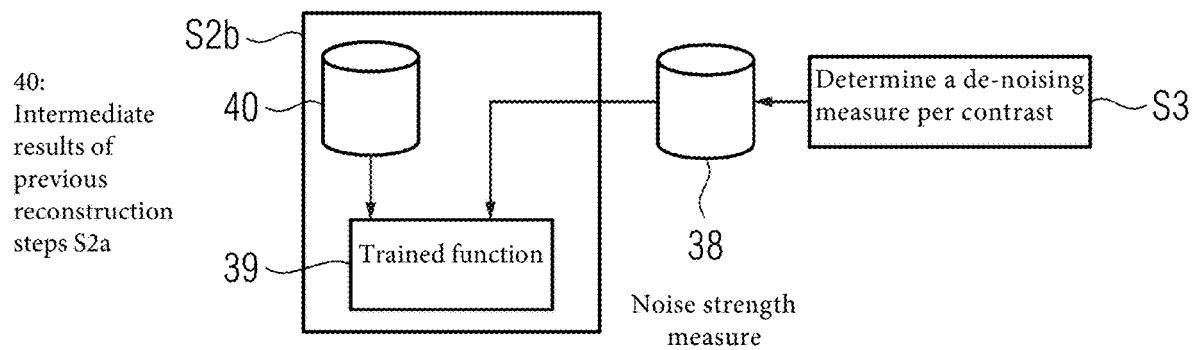
FIG. 5 illustrates an example functional diagram of a second embodiment of the disclosure.

In a second embodiment according to FIG. 5, the de-noising step S2b involves the application of a trained function 39, to which an intermediate result 40 of other, previous reconstruction steps S2a is input. As further input, the trained function 39, which may be e.g. a convolutional neural network 22 (CNN), receives the at least one noise strength measure 38 determined in step S3 as meta data. Here, the trained function 39 may have been actively trained to use the at least one noise strength measure concatenated with the intermediate result 40 as input, adapting the de-noising strength accordingly. In an embodiment, the trained function 39 may however have at least one parameter modifiable according to the at least one noise strength measure 38 to adapt the trained function 39 to apply a de-noising strength suitable for the currently evaluated contrast. Such approaches have, for example, been proposed regarding the style transfer technique.

Figure 6:
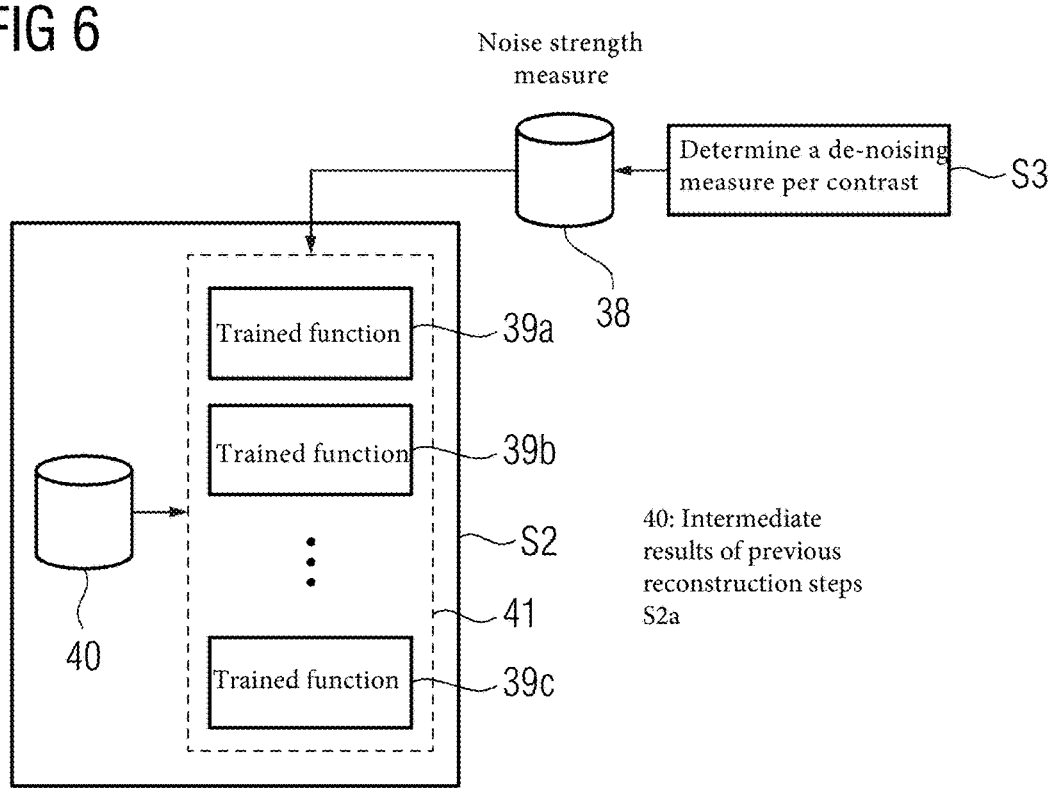
FIG. 6 illustrates an example functional diagram of a third embodiment of the disclosure.

A third approach and embodiment is illustrated in FIG. 6. Here, a set 41 of n trained functions 39a, 39b, ..., 39c is used. Each of these trained functions 39a, 39b, ..., 39c has been trained regarding a different de-noising strength and can be applied to an intermediate result 40 to denoise according to the de-noising strength. In this embodiment, the at least one noise strength measure 38 of step S3 is used to select one of the trained functions 39a, 39b, ..., 39c associated with a de-noising strength suitable for the currently processed contrast. These multiple trained functions 39a, 39b, ..., 39c may be trained using a common training data base, for example by artificially pre-adding noise requiring a defined de-noising strength to input training data.

Figure 7:
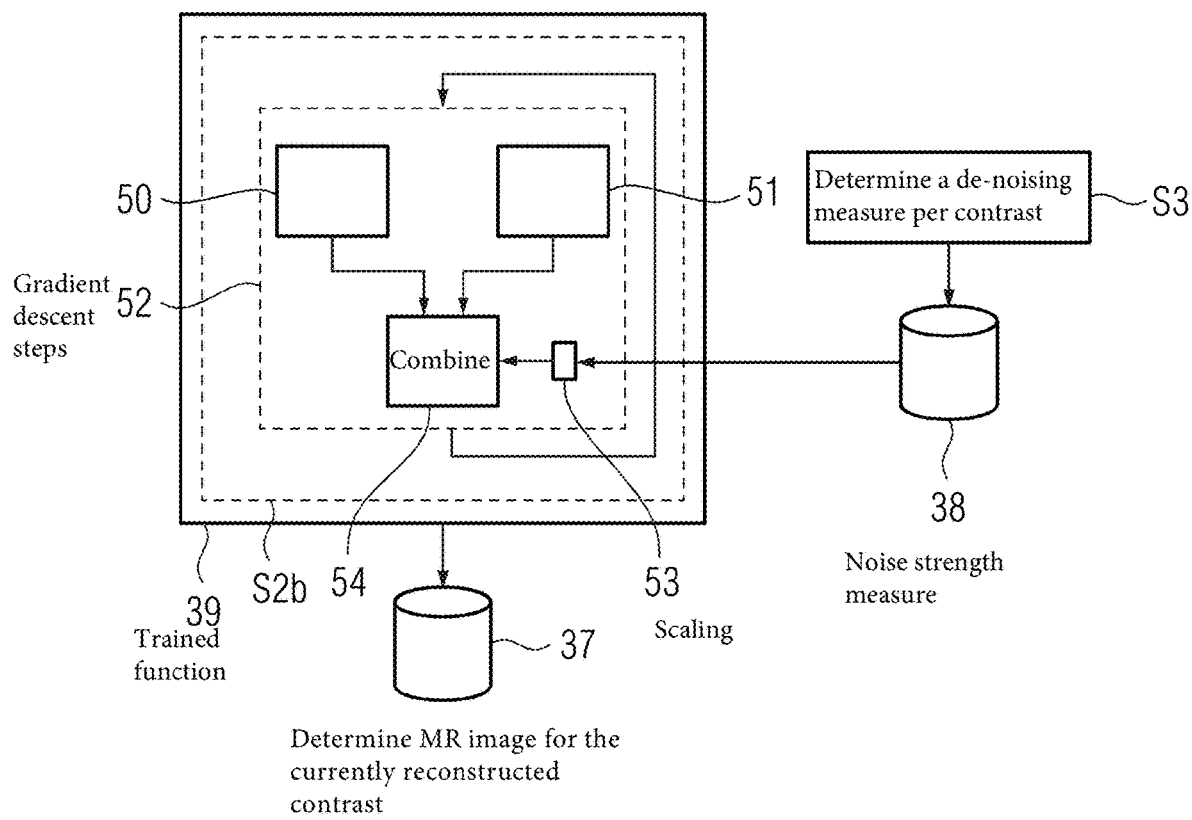
FIG. 7 illustrates an example functional diagram of a fourth embodiment of the disclosure.

A fourth approach and embodiment is illustrated in FIG. 7. The de-noising step S2b is, in this case, embedded into the application of a trained function 39, which comprises a variational neural network to determine magnetic resonance images 37 from k-space magnetic resonance data sets. In this variational neural network, data consistency steps 50 and regularization steps 51 are repeatedly performed for a number of iterations of gradient descent steps 52, wherein the results of the respective data consistency step 50 and regularization step 51 are combined in a step 54 according to a relative scaling 53. The relative scaling 54 is chosen dependent on the noise strength measure 38 determined in step S3 resulting in different de-noising strengths. For example, higher relative scaling 54 leads to higher de-noising strength.

Figure 8:
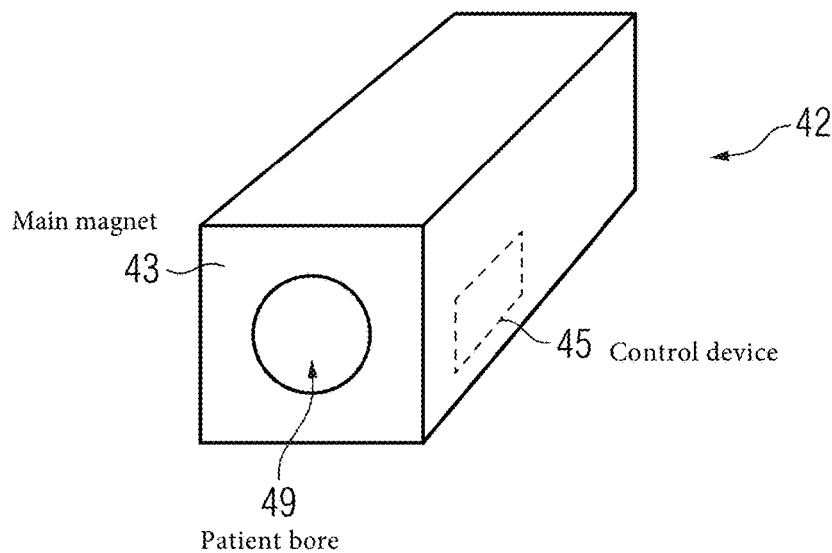
FIG. 8 illustrates an example magnetic resonance device according to one or more embodiments of the disclosure.

FIG. 8 illustrates an example magnetic resonance device 42 according to one or more embodiments of the disclosure. The magnetic resonance device 42 comprises a main magnet unit (also referred to herein as a magnetic or main magnet) 43 having a patient bore 49. Using a patient table (not shown), a patient can be introduced into the patient bore 49 to measure magnetic resonance signals of the patient. To perform magnetic resonance examinations, the magnetic resonance device 42 comprises respective components which are not shown for simplicity, for example the main magnet components, a gradient coil arrangement, and a high frequency coil arrangement.

Operation of the magnetic resonance device 42 is controlled by a control device (also referred to herein as a controller, control computer, or control circuitry) 45, which, although indicated at main magnet unit 43 in FIG. 7, may of course be distributed, e.g. comprise components outside a shielded room in which the main magnet unit 43 is located.

Figure 9:
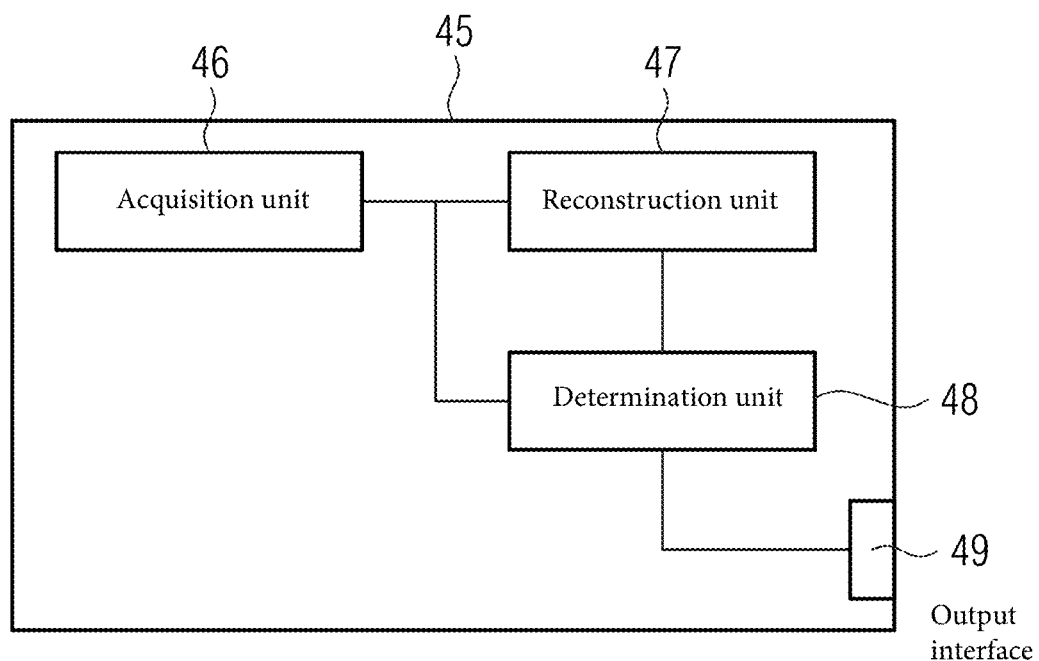
FIG. 9 illustrates an example functional structure of a control device of the magnetic resonance device according to one or more embodiments of the disclosure.

FIG. 9 illustrates an example functional structure of the control device 45 of the magnetic resonance device according to one or more embodiments of the disclosure. The control device 45 comprises an acquisition unit (also referred to herein as acquisition circuitry or an acquisition system) 46 configured to control the acquisition of magnetic resonance data using the respective components. For example, the acquisition unit is configured to acquire magnetic resonance data sets of different contrast using the acquisition technique according to step S1. The control device 45 further comprises a reconstruction unit 47 unit (also referred to herein as reconstruction circuitry or a reconstruction system) configured to perform the reconstruction according to step S2 and a determination unit 48 (also referred to herein as determination circuitry or a determination system) configured to determine the noise strength measure according to step S3. The resulting magnetic resonance images, wherein different de-noising strengths were applied for different contrasts, may be output via output interface 49 (e.g. a display) according to step S4.

Although the present disclosure has been described in detail with reference to exemplary embodiments, the present disclosure is not limited by the disclosed examples from which the skilled person is able to derive other variations without departing from the scope of the disclosure.

The various components described herein may be referred to as "units." Such components may be implemented via any suitable combination of hardware and/or software components as applicable and/or known to achieve their intended respective functionality. This may include mechanical and/or electrical components, processors, processing circuitry, or other suitable hardware components, in addition to or instead of those discussed herein. Such components may be configured to operate independently, or configured to execute instructions or computer programs that are stored on a suitable computer-readable medium. Regardless of the particular implementation, such units, as applicable and relevant, may alternatively be referred to herein as "circuitry," "controllers," "processors," or "processing circuitry," or alternatively as noted herein.

What is claimed is:

1. A computer-implemented method for determining magnetic resonance images showing different contrasts in an examination, comprising:
acquiring, using the same acquisition technique, magnetic resonance data sets for each one of a plurality of magnetic resonance images;
reconstructing the magnetic resonance images from their respective magnetic resonance data sets using at least one reconstruction algorithm by performing a de-noising operation,
determining, after the acquisition of the magnetic resonance data sets, a noise strength measure for each contrast associated with each respective one of the magnetic resonance data sets;
selecting, for the de-noising operation, individual de-noising strengths for each contrast depending on each respectively determined noise strength measure,
wherein a first image result for each contrast is obtained from reconstruction steps that are applied before performing the de-noising operation,
wherein the de-noising operation comprises applying a predefined de-noising strength to the first image result to determine a second image result; and
weightedly combining the first image result and the second image result to determine the magnetic resonance image by selecting weights dependent on the noise strength measure for each respective contrast.

2. The method according to claim 1, wherein the acquiring the magnetic resonance data sets of the different contrasts comprises:
acquiring each one of the magnetic resonance data sets of the different contrasts using the same measurement sequence and the same field of view, but with a respectively modified excitation sequence leading to different signal strengths for different contrasts.

3. The method according to claim 1, wherein the acquisition technique comprises diffusion weighted imaging, and wherein the different contrasts relate to different respective b values.

4. The method according to claim 1, wherein the determining the noise strength measure comprises determining the noise strength measure based upon a signal strength and/or a signal-to-noise ratio.

5. The method according to claim 1, wherein the de-noising operation is performed separately from other reconstruction steps and comprises a de-noising algorithm performed as a last step during reconstruction.

6. The method according to claim 1, wherein the de-noising operation comprises applying as the predefined de-noising strength, a predefined maximum de-noising strength to the first image result to determine the second image result.

7. The method according to claim 1, wherein the de-noising operation comprises an application of a trained function of a convolutional neural network.

8. The method according to claim 7, wherein the noise strength measure and/or a value derived from the noise strength measure are input as metadata to the trained function.

9. The method according to claim 8, wherein the noise strength measure is determined in a spatially resolved manner and provided as an input to the trained function as a part of a noise level map.

10. The method according to claim 7, further comprising:
providing multiple trained functions, each being trained for multiple de-noising strengths and/or de-noising strength intervals,
wherein, for each contrast, the trained function to be applied is selected depending on a respectively trained noise strength measure.

11. The method according to claim 7, wherein the trained function comprises a variational neural network used to reconstruct magnetic resonance images from k-space magnetic resonance data sets, and further comprising:
repeatedly performing a data consistency operation and a regularization operation to obtain de-noised magnetic resonance images; and
selecting a de-noising strength for each respective contrast by adapting a relative scaling between the data consistency operation and the regularization operation depending on the respective noise strength measure.

12. The method according to claim 1, further comprising:
displaying the magnetic resonance images;
updating the noise strength measure for at least one contrast based on received user input, and
repeating the de-noising step-operation for the respective contrast based upon the updated noise strength measure.

13. The method according to claim 1, wherein the same acquisition technique used to acquire the magnetic resonance data sets for each one of the plurality of magnetic resonance images comprises using the same measurement sequence.

14. The method according to claim 1 wherein the de-noising operation is a dedicated operation that is performed separately from other reconstruction steps.

15. A magnetic resonance device, comprising:
a main magnet; and
control circuitry configured to determine magnetic resonance images showing different contrasts in an examination by:
acquiring, using the same acquisition technique, magnetic resonance data sets for each one of a plurality of magnetic resonance images;
reconstructing the magnetic resonance images from their respective magnetic resonance data sets using at least one reconstruction algorithm by performing a de-noising operation,
determining, after the acquisition of the magnetic resonance data sets, a noise strength measure for each contrast associated with each respective one of the magnetic resonance data sets; and
selecting, for the de-noising operation, individual de-noising strengths for each contrast depending on each respectively determined noise strength measure,
wherein a first image result for each contrast is obtained from reconstruction steps that are applied before performing the de-noising operation,
wherein the de-noising operation comprises applying a predefined de-noising strength to the first image result to determine a second image result; and
weightedly combining the first image result and the second image result to determine the magnetic resonance image by selecting weights dependent on the noise strength measure for each respective contrast.

16. A non-transitory computer-readable storage medium configured to store executable instructions that, when executed via control circuitry of a magnetic resonance device, cause the magnetic resonance device to determine magnetic resonance images showing different contrasts in an examination by:
acquiring, using the same acquisition technique, magnetic resonance data sets for each one of a plurality of magnetic resonance images;
reconstructing the magnetic resonance images from their respective magnetic resonance data sets using at least one reconstruction algorithm by performing a de-noising operation,
determining, after the acquisition of the magnetic resonance data sets, a noise strength measure for each contrast associated with each respective one of the magnetic resonance data sets; and
selecting, for the de-noising operation, individual de-noising strengths for each contrast depending on each respectively determined noise strength measure,
wherein a first image result for each contrast is obtained from reconstruction steps that are applied before performing the de-noising operation,
wherein the de-noising operation comprises applying a predefined de-noising strength to the first image result to determine a second image result; and
weightedly combining the first image result and the second image result to determine the magnetic resonance image by selecting weights dependent on the noise strength measure for each respective contrast.

* * * * *